(12) United States Patent
Takeda et al.

(10) Patent No.: US 7,230,515 B2
(45) Date of Patent: Jun. 12, 2007

(54) PACKAGE FOR PARTS FOR LAN AND PULSE TRANSFORMER MODULE FOR LAN

(75) Inventors: Gentaro Takeda, Tokyo (JP); Mutsumi Kinoshita, Tokyo (JP); Mitsutaka Yasuda, Tokyo (JP)

(73) Assignee: TDK Corporation, Tokyo (JP)

( * ) Notice: Subject to any disclaimer, the term of this patent is extended or adjusted under 35 U.S.C. 154(b) by 18 days.

(21) Appl. No.: 11/279,684

(22) Filed: Apr. 13, 2006

(65) Prior Publication Data

US 2006/0291145 A1      Dec. 28, 2006

(30) Foreign Application Priority Data

Jun. 23, 2005   (JP)   ............... 2005-183809

(51) Int. Cl.
*H01F 27/02*   (2006.01)
(52) U.S. Cl. ....................................... 336/90
(58) Field of Classification Search ............. 336/65, 336/90, 92, 94, 96, 192, 229; 174/50, 536–8
See application file for complete search history.

(56) References Cited

U.S. PATENT DOCUMENTS

| | | | | |
|---|---|---|---|---|
| 4,641,112 | A * | 2/1987 | Kohayakawa | ............... 333/140 |
| 5,402,321 | A * | 3/1995 | Izu et al. | .................... 361/807 |
| 6,149,050 | A * | 11/2000 | Lai et al. | ................. 228/180.1 |
| 6,225,560 | B1 * | 5/2001 | Machado | .................... 174/556 |
| 6,512,175 | B2 * | 1/2003 | Gutierrez | .................... 174/538 |
| 6,570,478 | B2 * | 5/2003 | Meeks | .......................... 336/229 |
| 6,593,840 | B2 * | 7/2003 | Morrison et al. | ........... 336/192 |
| 6,912,781 | B2 * | 7/2005 | Morrison et al. | ............. 29/854 |
| 6,946,942 | B1 * | 9/2005 | Chih-Min | .................... 336/90 |

FOREIGN PATENT DOCUMENTS

| | | |
|---|---|---|
| JP | 2005-093784 | 4/2004 |
| JP | 2004-281727 | 10/2004 |
| JP | 2004-281737 | 10/2004 |

\* cited by examiner

*Primary Examiner*—Tuyen T Nguyen
(74) *Attorney, Agent, or Firm*—Oblon, Spivak, McClelland, Maier & Neustadt, P.C.

(57) ABSTRACT

A resin-made base body 1 has first recessed portions 11 and 12 for respectively accommodating a plurality of pulse transformers as well as second recessed portions 13 and 14 for accommodating common mode choke coils which are respectively connected to the pulse transformers. The first recessed portions 11 and 12 are formed on one terminal fixing edge 7 side of the base body 1. The second recessed portions 13 and 14 are formed on the other terminal fixing edge 10 side. The first recessed portions 11 and 12 and the second recessed portions 13 and 14 are arranged by being longitudinally connected in a direction from the one terminal fixing edge 7 toward the other terminal fixing edge 10. The adjacent first recessed portions 11 and 12 are connected at one end portion, and the adjacent second recessed portions 13 and 14 are also formed by being connected at one end portion. Thus, provided are a package for parts for LAN and a module for LAN which is miniaturized, and the insertion loss is reduced.

7 Claims, 7 Drawing Sheets

PACKAGE FOR PARTS FOR LAN AND PULSE TRANSFORMER MODULE FOR LAN

BACKGROUND OF THE INVENTION

The present invention relates to a surface mounted package for accommodating pulse transformers and common mode choke coils, which constitute a LAN (local area network) for connecting electronic office equipment, and a pulse transformer module for LAN using the same.

Parts for LAN consisting of pulse transformers and common mode choke coils are required to be compact and thin in conjunction with requirements for the miniaturization of electronic office equipment such as personal computers. To cope with such requirements, JP-A-2004-281727 has already proposed a package such as the one shown in FIG. 12. This package is arranged such that pulse transformers (hereafter, sometimes referred to as PTs) 51 and 52 on reception and transmission sides, as well as common mode choke coils (hereafter, sometimes referred to as CMCs) 53 and 54 which are respectively connected to these PTs 51 and 52, are accommodated in a package 55. The package 55 has recessed portions 56 and 57 for respectively accommodating the PTs 51 and 52 and recessed portions 59 and 60 for accommodating the CMCs 53 and 54.

Reference numerals 61 to 66 denote terminals which are fixed to one terminal fixing edge 67 of the package 55, and numerals 68 to 73 denote terminals which are fixed to the other terminal fixing edge 74. The terminals 61 and 62 are terminals for connecting the terminals of the primary winding of the PT 51, and the terminal 63 is a terminal which is connected to a center tap of the primary winding of the PT 51 through a wire. The terminals 65 and 66 are terminals for connecting the terminals of the primary winding of the PT 52, and the terminal 64 is a terminal which is connected to a center tap of the primary winding of the PT 52 through a wire.

Lead wires of the secondary windings of the PTs 51 and 52 are respectively wound around the CMCs 53 and 54. The lead wires of the secondary winding of the PT 51 wound around the CMC 53 are connected to the terminals 68 and 69. The lead wires of the secondary winding of the PT 52 wound around the CMC 54 are connected to the terminals 72 and 73. The terminals 70 and 71 are respectively connected to center taps of the secondary windings of the PTs 51 and 52 through wires.

Toroidal cores of the PTs 51 and 52 mounted in this package 55 have larger diameters than toroidal cores of the CMCs 53 and 54, the PTs 51 and 52 are located on both end sides of the package 55, and the CMCs 53 and 54 are disposed at the clearance between the PTs 51 and 52. In addition, as the CMCs 53 and 54 are disposed in terminal intervals a and b of the terminals 63 and 64 as well as 70 and 71 in central portions of the terminal fixing edges 67 and 74, the width W in opposing directions of the terminal fixing edges 67 and 74 of the package 55 are set to a predetermined width or less, thereby making the package 55 compact.

In the package shown in FIG. 12, the CMCs 53 and 54 are disposed in the clearance between the PTs 51 and 52, and the space where the CMCs 53 and 54 are disposed is secured by making use of the intervals between the terminals 63 and 64 and the terminals 70 and 71, thereby making it possible to set width W in the opposing directions of the terminal fixing edges 67 and 74 to a small width and realize the miniaturization. However, with such a layout, there is a drawback in that the routing of the leads of one CMC becomes long, and an adverse effect has been imparted to the insertion loss characteristic.

SUMMARY OF THE INVENTION

An object of the present invention is to provide a package for parts for LAN and a pulse transformer module for LAN in which the package disclosed in JP-A-2004-281737 is improved and is further miniaturized, and the insertion loss is reduced.

A package for parts for LAN in accordance with the invention is a package for parts for LAN of a surface mounting type having a resin-made base body which is square, in which pluralities of terminals are respectively fixed at two opposing edges thereof, and which are adapted to accommodate a plurality of pulse transformers and a plurality of common mode choke coils which are respectively connected to the pulse transformers, the package including: a plurality of first recessed portions for respectively accommodating the plurality of pulse transformers and a plurality of second recessed portions having smaller diameters than those of the first recessed portions and adapted to respectively accommodate the plurality of common mode choke coils, the plurality of first recessed portions and the plurality of second recessed portions being provided in the surface of the base body where the parts are mounted, wherein the first recessed portions are formed on one terminal fixing edge side of the base body, and the second recessed portions are formed on another terminal fixing edge side thereof, the first recessed portions and the second recessed portions being arranged by being longitudinally connected in a direction from the one terminal fixing edge toward the other terminal fixing edge.

In addition, the package for parts for LAN in accordance with the invention is characterized in that adjacent ones of the first recessed portions and the second recessed portions are formed by being connected at one portion thereof.

In addition, the package for parts for LAN in accordance with the invention is characterized in that adjacent ones of the first recessed portions are formed by being connected at one portion thereof.

In addition, the package for parts for LAN in accordance with the invention is characterized in that an inner wall of at least one of the first recessed portions and the second recessed portions on the adjacent terminal fixing edge side is formed in a flat shape parallel to the terminal fixing edge.

In addition, the package for parts for LAN in accordance with the invention is characterized in that an inner wall of the first recessed portion on a side surface side thereof is formed in a flat shape parallel to the terminal fixing edge.

In addition, the package for parts for LAN in accordance with the invention is characterized by further comprising: a resin-made square cover which is combined with the base body, wherein the cover has joining plate portions provided projectingly for being joined to the base body and retaining pawls respectively provided at distal ends of the joining plate portions, the joining plate portions and the retaining pawls being provided on a second recessed portion side on both side surfaces perpendicular to the terminal fixing edge when combined with the base body, wherein a pair of recessed portions are each provided on an outer side surface portions at a portion corresponding to the second recessed portion of the base body, and a pair of stepped portions are each provided by further recessing a base body fitting surface side of the recessed portion, and wherein the joining plate portions on both sides of the cover are respectively pressed and fitted to the recessed portions on the both side surfaces of the base body by making use of the resiliency of the joining plate portions, and the retaining pawls at the distal ends of the joining plate portions are respectively retained by the stepped portions, to thereby combine the cover with the base body.

A pulse transformer module for LAN uses the above-described package for parts for LAN, and is characterized in that the pulse transformers are respectively accommodated in the first recessed portions, and that the common mode choke coils are respectively accommodated in the second recessed portions.

In the invention, this embodiment, the plurality of PTs are juxtaposed adjacent to each other in a direction in which the terminals are arranged (transverse direction), the plurality of CMCs are also juxtaposed adjacent to each other in the direction in which the terminals are arranged, and the first recessed portions and the second recessed portions are arranged by being longitudinally connected in a direction from the one terminal fixing edge toward the other terminal fixing edge. Therefore, it is possible to make the transverse width of the package small. Accordingly, it is possible to attain the miniaturization of the package, i.e., the pulse transformer module for LAN. Furthermore, it is possible to shorten the length of each lead wire between the PT and the CMC and the length of each lead wire between the CMC and the terminal, thereby making it possible to reduce the insertion loss.

In the invention, the PTs and the CMCs which are connected thereto are arranged in the longitudinal direction, and the first recessed portions and the second recessed portions for respectively accommodating the PTs and the CMCs are formed by being connected at one portions thereof, so that it is possible to set the longitudinal width of the package even smaller.

Since adjacent ones of the first recessed portions provided in the base body for accommodating the PTs are formed by being connected at one portion thereof, it is possible to make the transverse width of the package even smaller. Accordingly, it is possible to attain a further miniaturization of the package, i.e., the pulse transformer module for LAN.

Further, since the first recessed portion and the second recessed portion for respectively accommodating the PT and the CMC which are connected to each other are formed by being connected at one portion thereof, it is possible to further shorten the length of each lead wire between the PT and the CMC and the length of each lead wire between the CMC and the terminal, making it possible to further reduce the insertion loss.

It should be noted that in order to set the longitudinal width of the package similarly to or less than a conventional width, it is necessary to make the outside diameter of the toroidal core of the PT small. However, the inside diameter cannot be made small to secure the same number of turns, with the result that the cross-sectional area of the core also becomes small, so that it is impossible to satisfy the characteristic that "the inductance value with 8 mA superposed should be greater than or equal to 350 μH" in ISO 8802.3 which is the standard for the LAN transmission path. To overcome this problem, the characteristic can be satisfied by compensating for the reduced portion of the cross-sectional area of the core by making the thickness of the toroidal core larger than the conventional thickness, and by slightly increasing the number of turns.

In the package for parts for LAN in accordance with the invention, since the inner wall of at least one of the first recessed portions and the second recessed portions on the adjacent terminal fixing edge side is formed in a flat shape parallel to the terminal fixing edge, it is possible to reduce the longitudinal width of the package, and ensure the terminal mounting strength of the terminal fixing edge portion.

In the package for parts for LAN in accordance with the invention, since the inner wall of the first recessed portion on a side surface side thereof is formed in a flat shape parallel to the terminal fixing edge, it is possible to reduce the transverse width of the package.

Furthermore, the package for parts for LAN in accordance with the invention is so structured that a cover for being combined with the base body is further provided, and joining plate portions provided on the cover are respectively fitted in recessed portions provided in the side surfaces on the second recessed portion sides of the base body, retaining pawls at the distal ends of the joining plates portions being respectively retained by stepped portions each provided by recessing a lower portion (mounting surface side) of the recessed portion of the side surface. Therefore, it is possible to keep the width between both side surfaces of the cover to the width between both side surfaces of the base body. In addition, the first recessed portions having large diameters can be formed up to the vicinities of the outer surfaces of the base body, the transverse width between both side surfaces of the base body can be made small, which contributes to the miniaturization.

According to the pulse transformer module for LAN in accordance with the invention, since the PTs and CMCs are arranged to be respectively accommodated in the first recessed portions and the second recessed portions, it is possible to provide a pulse transformer module for LAN which is compact, and in which the insertion loss is reduced.

DETAILED DESCRIPTION OF THE PREFERRED EMBODIMENTS

Figure 1:
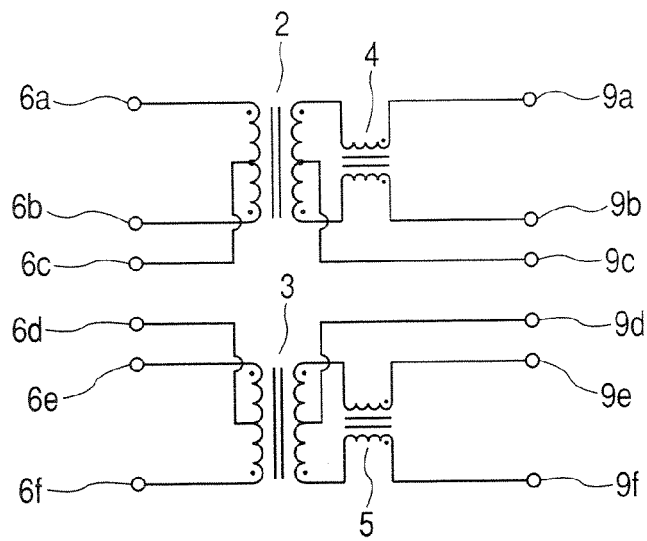
FIG. 1 is a diagrams of an example of an electric circuit of a pulse transformer module for LAN in accordance with the invention.
Figure 2A:
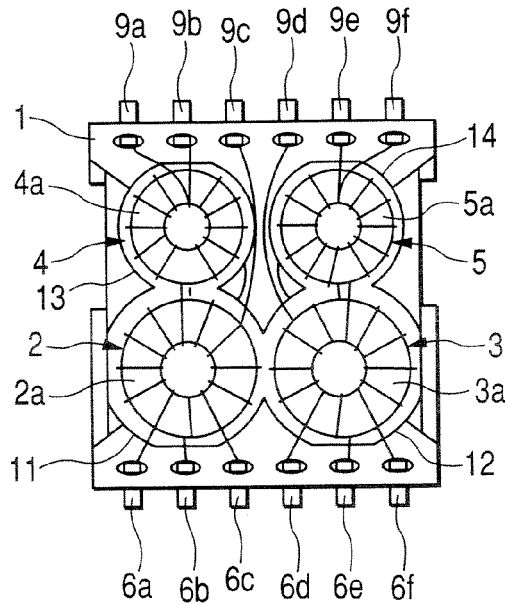
FIGS. 2A and 2B are plan views of embodiments of a base body for making up a package for parts for LAN in accordance with the invention, and illustrates a state in which the parts are mounted.
Figure 2B:
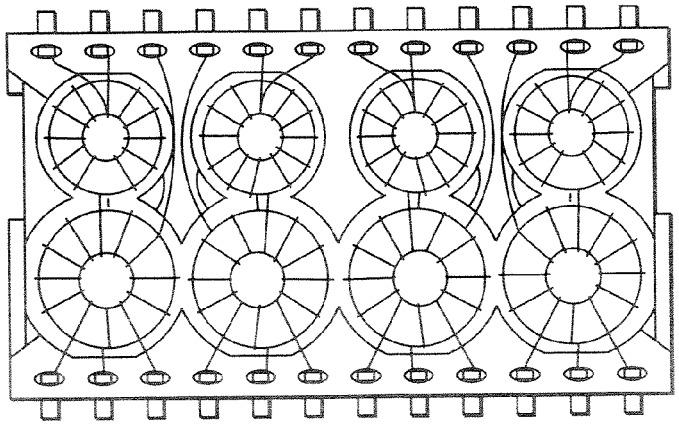

FIG. 1 is a diagram illustrating an example of an electric circuit of a pulse transformer module for LAN in accordance with the invention. FIGS. 2A and 2B are plan views of embodiments of a base body for making up a package for parts for LAN in accordance with the invention, and illustrates a state in which the parts are mounted. In FIGS. 1 and 2A, reference numeral 1 denotes a resin-made base body, and numerals 2 and 3 denote PTs on the reception side and the transmission side. Numerals 4 and 5 denote CMCs which are respectively connected to the reception-side PT2 and the transmission-side PT3. In these PTs 2 and 3, primary windings and secondary windings are respectively wound around toroidal cores 2a and 3a by means of wires. In the CMCs 4 and 5, lead wires of the secondary windings of the PTs 2 and 3 are respectively wound around toroidal cores 4a and 5a.

Reference characters 6a to 6f denote terminals which are arranged and fixed at equal intervals along one terminal fixing edge 7 of the base body 1 which is square. Reference characters 9a to 9f are terminals which are arranged and fixed at equal intervals along the other terminal fixing edge 10.

The terminals 6a and 6b are terminals for connecting the terminals of the primary winding of the PT 2, and the terminal 6c is a terminal which is connected to a center tap of the primary winding of the PT 2 through a wire. The terminals 6e and 6f are terminals for connecting the terminals of the primary winding of the PT 3, and the terminal 6d is a terminal which is connected to a center tap of the primary winding of the PT 3 through a wire. Lead wires of the secondary windings of the PTs 2 and 3 are respectively wound around the CMCs 4 and 5. The lead wires of the secondary winding of the PT 2 wound around the CMC 4 are connected to the terminals 9a and 9b. The lead wires of the secondary winding of the PT 3 wound around the CMC 5 are connected to the terminals 9e and 9f The terminals 9c and 9d are respectively connected to center taps of the secondary windings of the PTs 2 and 3 through wires.

Reference numerals 11 and 12 denotes first recessed portions which are provided in the parts mounting surface of the base body 1 so as to accommodate the PTs 2 and 3, respectively. Reference numerals 13 and 14 denote SECOND recessed portions which are provided in the same surface so as to accommodate the CMCs 4 and 5, respectively.

Figure 3:
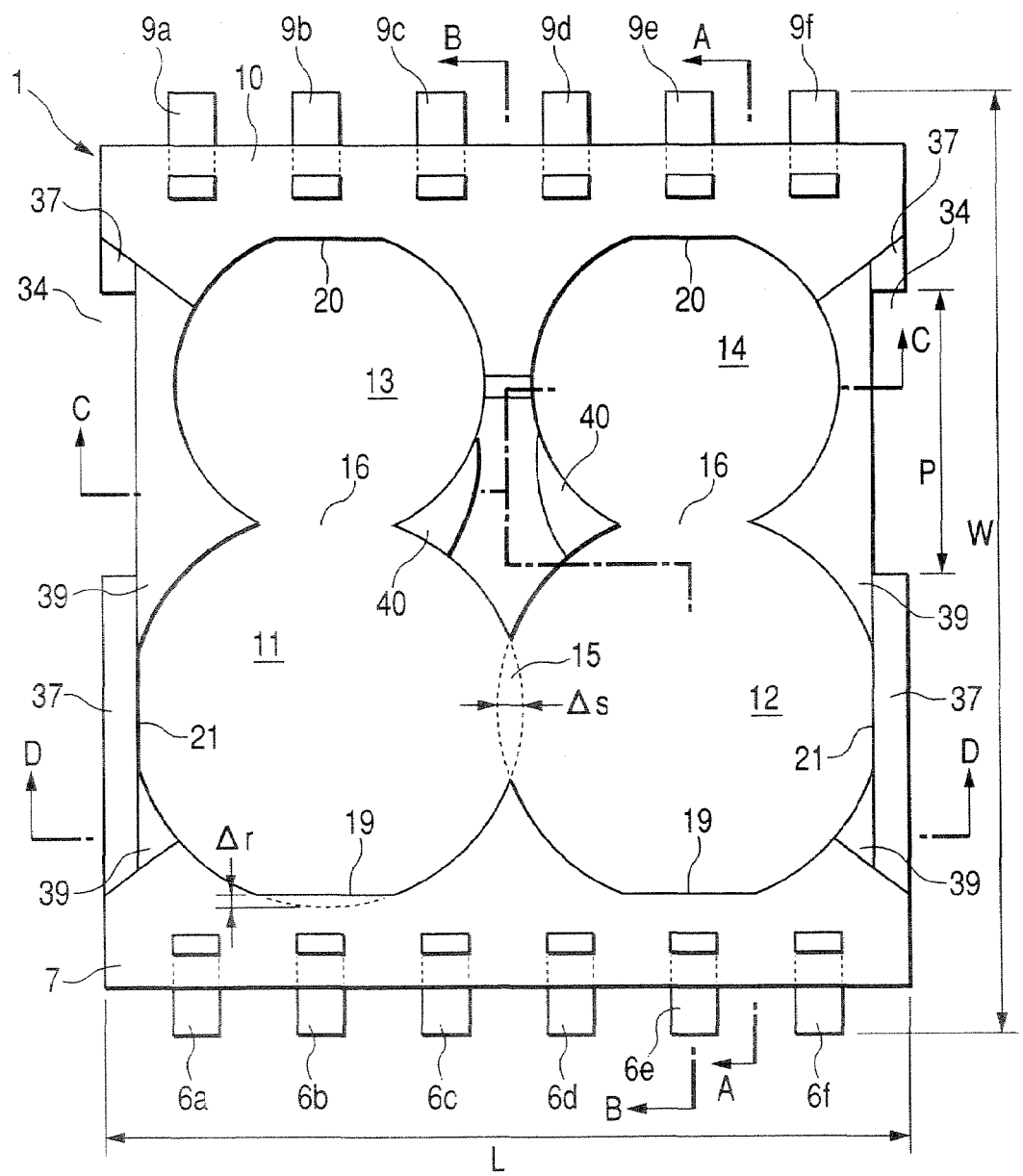
FIG. 3 is a plan view illustrating the base body of the package in accordance with the embodiment.
Figure 4:
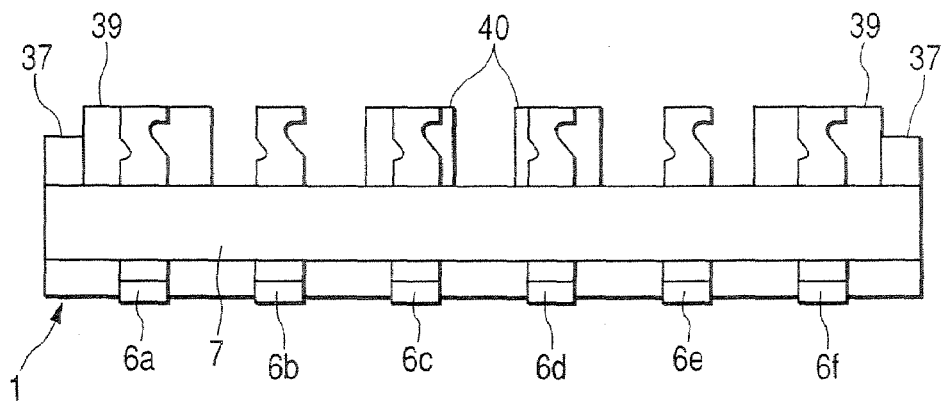
FIG. 4 is a front view of the base body in accordance with the invention.
Figure 5:
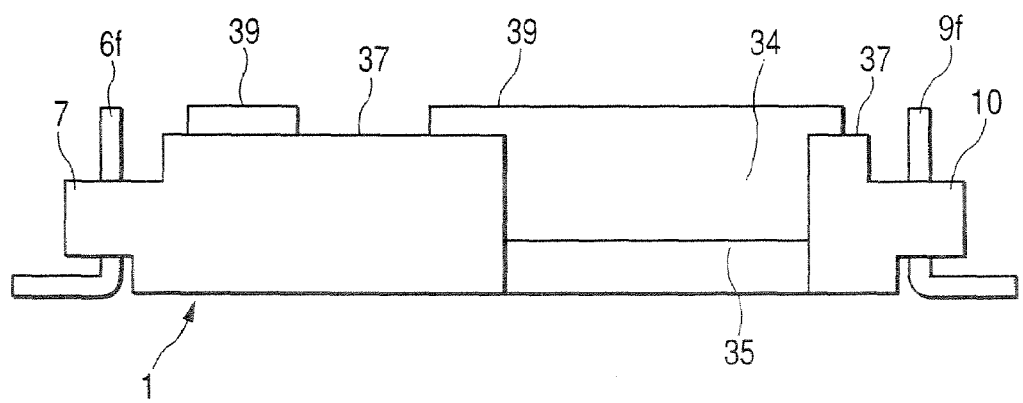
FIG. 5 is a side view of the base body in accordance with the invention.
Figure 6:
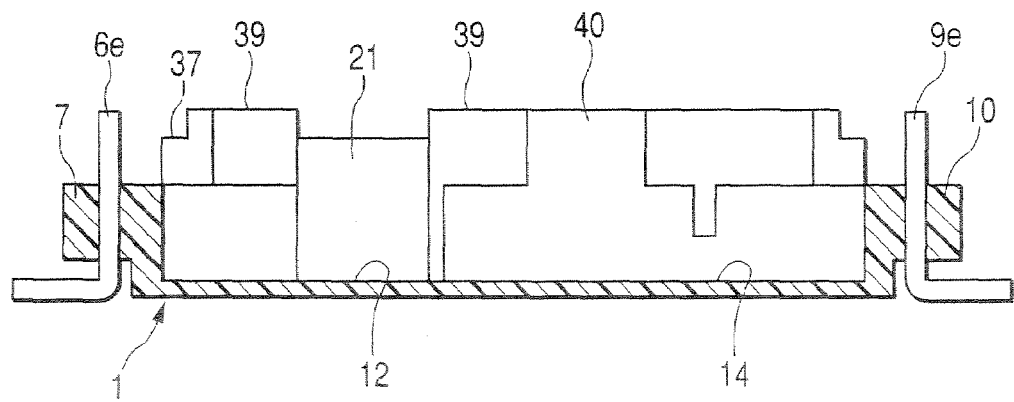
FIG. 6 is a cross-sectional view taken along line A—A in FIG. 3.
Figure 7:
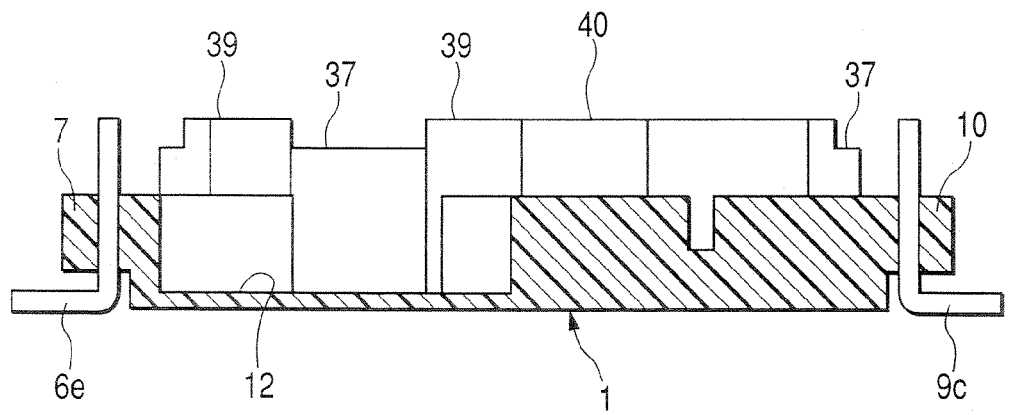
FIG. 7 is a cross-sectional view taken along line B—B in FIG. 3.
Figure 8:
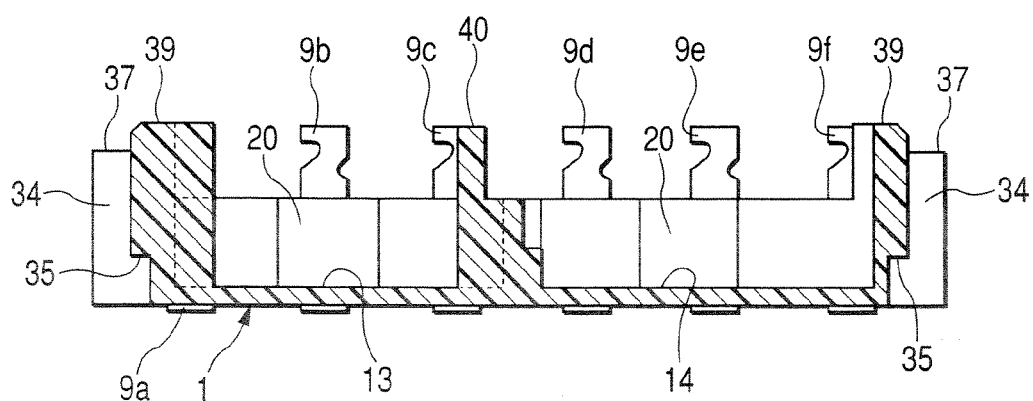
FIG. 8 is a cross-sectional view taken along line C—C in FIG. 3.
Figure 9:
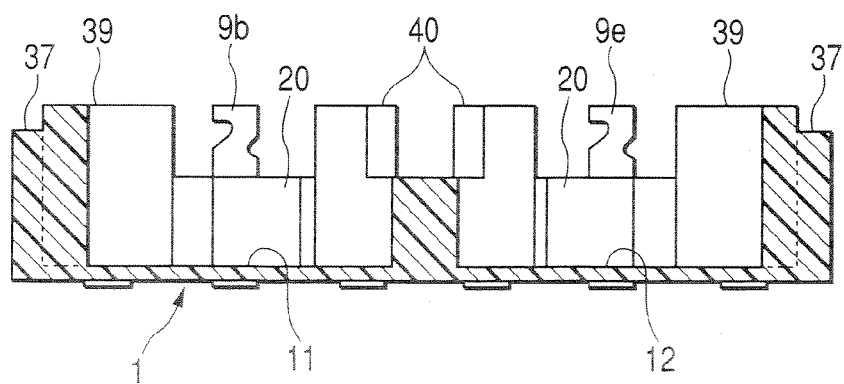
FIG. 9 is a cross-sectional view taken along line D—D in FIG. 3.

FIG. 3 is a plan view illustrating the base body 1 in an enlarged form, and FIGS. 4 and 5 are a front view and a side view, respectively. In addition, FIG. 6 is a cross-sectional view taken along line A—A in FIG. 3; FIG. 7 is a cross-sectional view taken along line B—B in FIG. 3; FIG. 8 is a cross-sectional view taken along line C—C in FIG. 3; and FIG. 9 is a cross-sectional view taken along line D—D in FIG. 3.

As shown in FIG. 3, the first recessed portions 11 and 12 for respectively accommodating the PTs 2 and 3 are formed by being juxtaposed adjacently to a side of the terminal fixing edge 7 where the terminals 6a to 6f are arranged and fixed. These first recessed portions 11 and 12 are formed by being connected to each other at a portion 15. In addition, the second recessed portions 13 and 14 for respectively accommodating the CMCs 4 and 5 are formed by being juxtaposed adjacently to a terminal fixing edge 10 where the terminals 9a to 9f are arranged and fixed.

The first recessed portion 11 and the second recessed portion 13 for respectively accommodating the PT 2 and the CMC 4 which are connected to each other are formed by being juxtaposed in a longitudinal direction which is the direction in which the terminal fixing edges 7 and 10 are opposed to each other. In addition, these recessed portions 11 and 13 are formed by being connected to each other at a portion 16 thereof.

Similarly, the first recessed portion 12 and the second recessed portion 14 for respectively accommodating the PT 3 and the CMC 5 which are connected to each other are also formed by being juxtaposed in the longitudinal direction and by being connected to each other at a portion 16 thereof.

In this embodiment, inner walls 19 of the first recessed portions 11 and 13 on the adjacent terminal fixing edge 7 side are formed in a flat shape parallel to the terminal fixing edge 7. In addition, inner walls 20 of the second recessed portions 13 and 14 on the adjacent terminal fixing edge 10 side are also formed in a flat shape parallel to the terminal fixing edge 10.

In addition, in this embodiment, inner walls 21 of the first recessed portions 11 and 12 on the side surface sides of the base body 1 are formed in a flat shape parallel to the side surface of the base body 1.

Figure 10A:
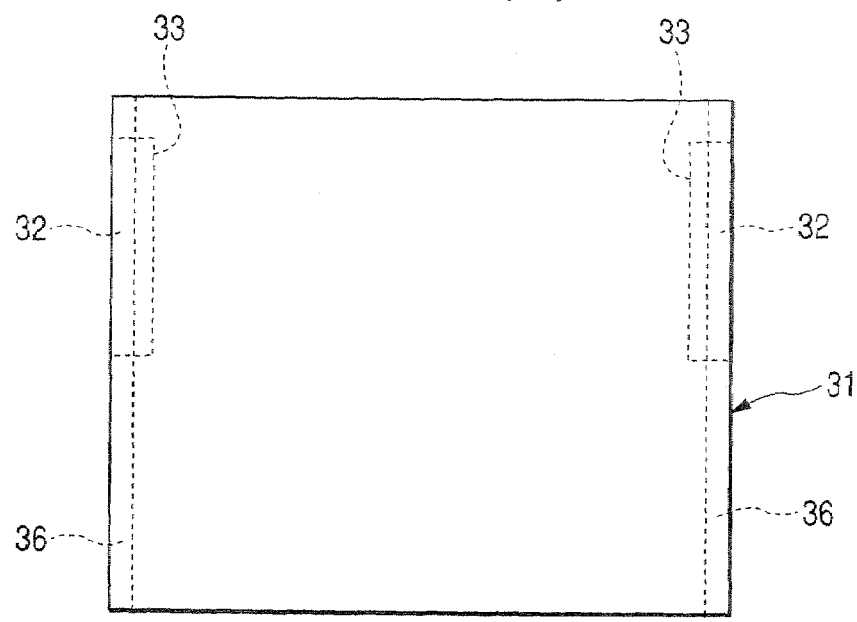
FIGS. 10A, 10B, and 10C are, respectively, a plan view, a side view, and a front view illustrating a cover for making up the package in accordance with the embodiment.
Figure 10B:
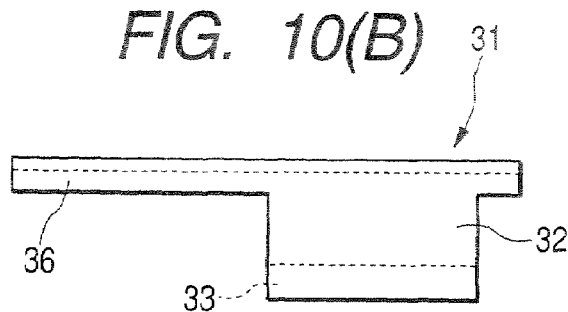
Figure 10C:
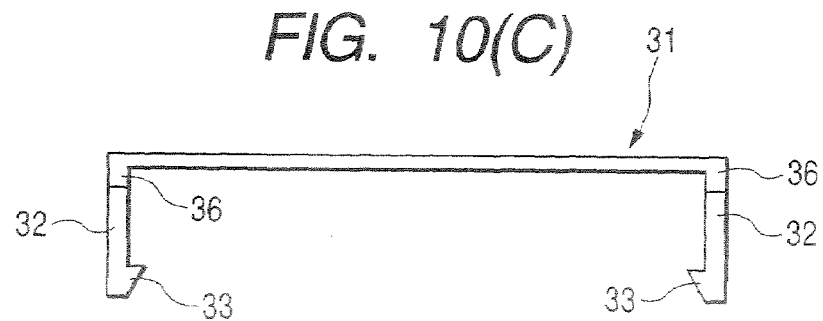
Figure 11A:
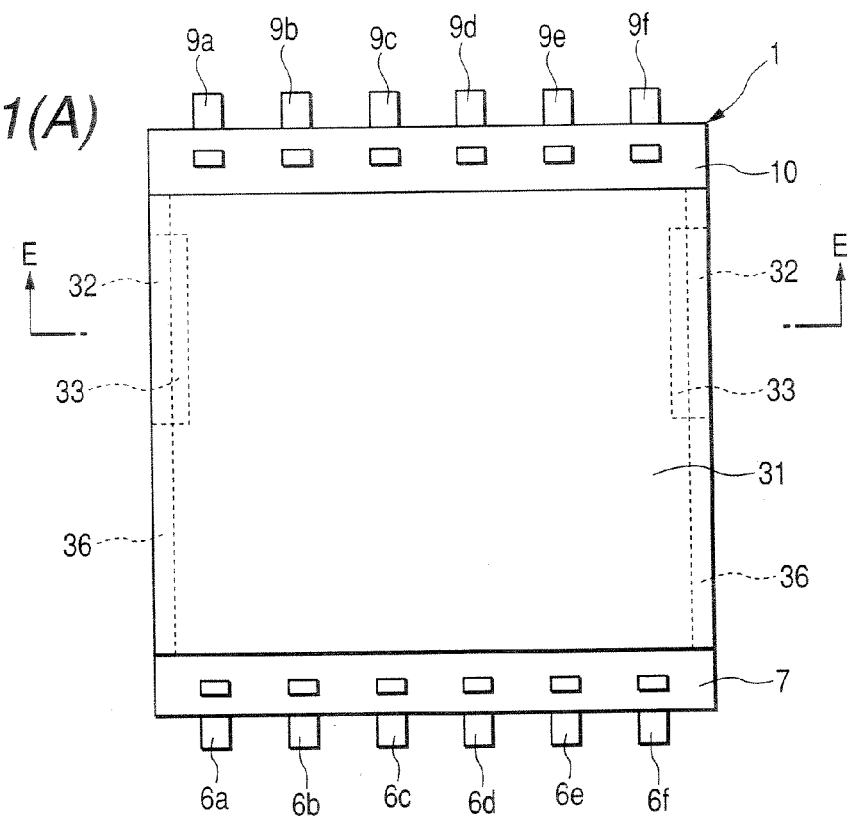
FIGS. 11A, 11B, and 11C are, respectively, a plan view, a side view, and a cross-sectional view, taken along line E—E in FIG. 11A, illustrating the package in accordance with the embodiment.
Figure 11B:
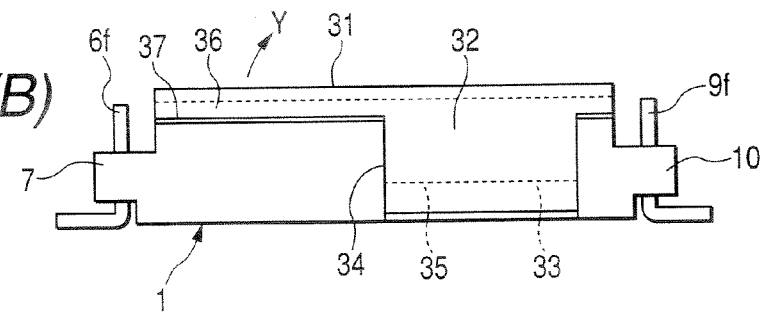
Figure 11C:
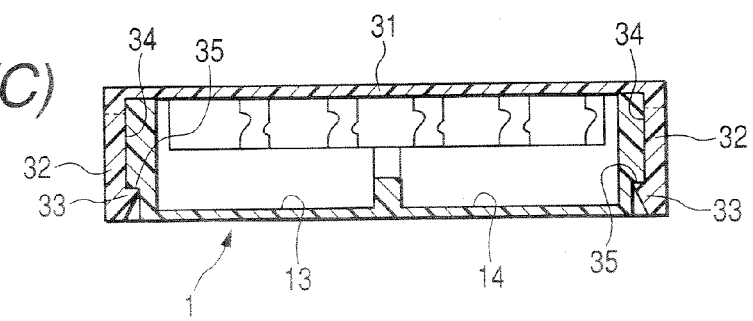
Figure 12:
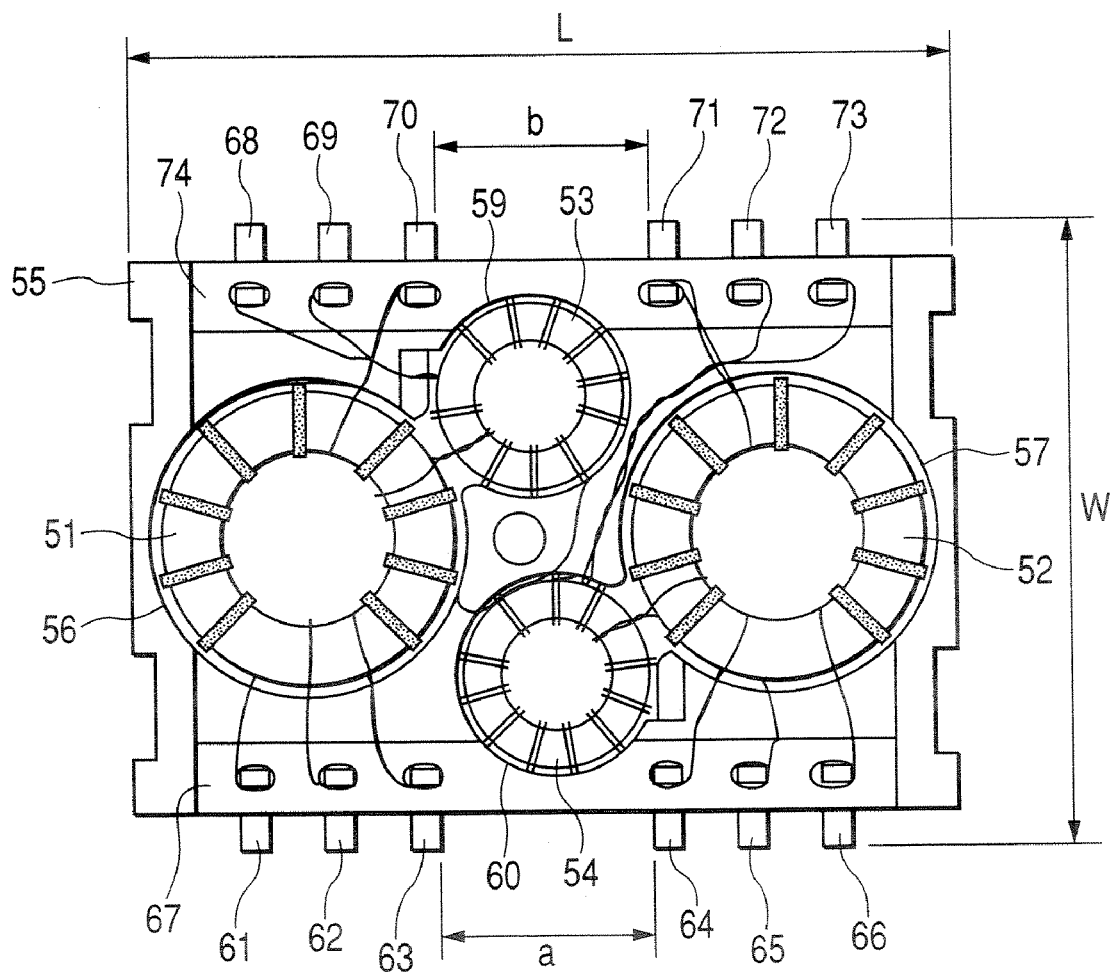
FIG. 12 is a plan view of a conventional package for parts for LAN.

FIGS. 10A to 10C show a cover 31 which is combined with the base body 11. FIG. 10A is a plan view, FIG. 10B is a side elevational view, and FIG. 10C is a front elevational view. In addition, FIGS. 11A to 11C show a state in which this cover 31 is combined with the base body 1. FIG. 11A is a plan view, FIG. 11B is a side elevational view, and FIG. 11C is a cross-sectional view taken along line E—E of FIG. 11A.

As shown in FIGS. 10A to 10C and 11A to 11C, joining plate portions 32 are projectingly provided on the second recessed portion 13 side and the second recessed portion 14 side in both side surfaces of the cover 31. Retaining pawls 33 are respectively provided at distal ends of the joining plate portions 32. Meanwhile, as shown in FIGS. 3, 5, and 7, recessed portions 34 are provided in outer surfaces of the base body 1 corresponding to the second recessed portions 13 and 14. At the same time, stepped portions 35 are respectively provided by further recessing lower sides of the recessed portions 34, i.e., the mounting surface side of the base body 1. The width p (see FIG. 3) of the recessed portion 34 is formed to be slightly wider than the width of the joining plate portion 32.

Further, as shown in FIGS. 11A to 11C, the joining plate portions 32 on both sides of the cover 31 are pressed and fitted to the recessed portions 34 on both side surfaces of the base body 1 by making use of the resiliency of the joining plate portions 32, and the retaining pawls 33 at the distal ends of the joining plate portions 32 are retained at the stepped portions 35, thereby combining the cover 31 with the base body 1. At this time, a pair of sleeve portions 36 projecting from both sides of the cover 31 with a projection amount smaller than that of the joining plate portion 32 abut against a pair of receiving portions 37 (see FIGS. 3 to 9) formed on both side surface portions of the base body 1 in such a manner as to project upwardly, thereby closing the gaps at the package side surface portions between the base body 1 and the cover 31.

In addition, inner surfaces of the sleeve portions 36 of this cover 31 abut against flat-shaped outer surfaces of projecting portions 39 which are formed on inner sides of the receiving portions 37 in such a manner as to project upwardly, so that the rattling of the cover 31 in its rotating direction with respect to the base body 1 is prevented. These projecting portions 39 are provided to form portions of the first recessed portions 11 and 12 and the second recessed portions 13 and 14, and inner surfaces of these projecting portions 39 are formed in an arcuate shape. As for portions of these projecting portions 39 corresponding to the first recessed portions 11 and 12, portions where the inner walls 21 are formed in a flat shape are cut off. Reference numeral denotes a projecting portion which is formed in the interior of the base body 1 in such a manner as to project up to the same height as that of the projecting portions 39.

In the package in accordance with this embodiment, since the PTs 2 and 3 are juxtaposed adjacent to each other in the transverse direction, the CMCs 4 and 5 are also juxtaposed adjacent to each other in the transverse direction, and the adjacent first recessed portions 11 and 12 for accommodating the PTs 2 and 3 provided in the base body 1 are formed by being connected at the portion 15. Therefore, it is possible to make small the transverse width L (see FIG. 3) of the package (base body 1).

In addition, since the PTs 2 and 3 and the CMCs 4 and 5, which are connected thereto, are arranged in the longitudinal direction, and the first recessed portions 11 and 12 and the second recessed portions 13 and 14 for respectively accommodating the PTs 2 and 3 and the CMCs 4 and 5 are formed by being connected to each other at their portions 16, it is also possible to set the width W in the longitudinal direction of the package (base body 1) including the terminals to a small width. Accordingly, it is possible to attain the miniaturization of the package, i.e., the pulse transformer module for LAN.

In addition, the first recessed portions 11 and 12 and the second recessed portions 13 and 14 for respectively accommodating the PTs 2 and 3 and the CMCs 4 and 5 which are connected to each other are arranged in the longitudinal direction by being connected to each other at the portions 16. Therefore, it is possible to shorten all of the length of the lead wires between the PTs 2 and 3 and the CMCs 4 and 5, the length of the lead wires between the PTs 2 and 3 and the terminals 6a to 6f, and the length of the lead wires between the CMCs 4 and 5 and the terminals 9a to 9f, thereby making it possible to reduce the insertion loss.

In addition, in this embodiment, the inner walls 19 and 20 of the first recessed portions 11 and 12 and the second recessed portions 13 and 14 on the adjacent terminal fixing edge 7 side and the adjacent terminal fixing edge 10 side are formed in a flat shape parallel to the terminal fixing edges 7 and 10. Therefore, it is possible to ensure the terminal mounting strength of the portions of the terminal fixing edges 7 and 10 without increasing the longitudinal width W of the base body 1, i.e., the package. It should be noted that the formation of these flat inner walls 19 and 20 may be effected for only one of the first recessed portions 11 and 12 or the second recessed portions 13 and 14.

In addition, in this embodiment, since the inner walls 21 of the first recessed portions 11 and 12 on the side surface sides of the base body 1 are formed in a flat shape parallel to the side surface of the base body 1, it is possible to shorten the transverse width of the package.

It should be noted that a radial dimensional difference Δr (representatively shown in the first recessed portion 11 in FIG. 3) between the case where these inner walls 19, 20, and 21 are provided and the case where these inner walls 19, 20, and 21 are not provided and, instead, the inner walls are formed in an arcuate shape to be originally formed should preferably be set to 0.05 to 0.15 mm or thereabouts. If this dimensional difference Δr is less than 0.05 mm, the degree of contribution to the miniaturization is not sufficient, and if it exceeds 0.15 mm, there is a possibility of virtually hampering the accommodation of the PTs 2 and 3 and the CMCs 4 and 5. Further, the overlapping width of the first recessed portions 11 and 12 and the overlapping width Δs (representatively shown in the overlapping portion 15 in FIG. 3) of each of the first recessed portions 11 and 12 and each of the second recessed portions 13 and 14 should be set to 0.1 to 0.2 mm or thereabouts.

In addition, if the structure adopted is such that, as in this embodiment, the joining plate portions 32 are fitted in the recessed portions 34 provided in the side surfaces on the second recessed portion 13 side and the second recessed portion 14 side to allow the retaining pawls 33 to be retained by the stepped portions 35, it is possible to keep the width between both side surfaces of the cover 31 to the width between both side surfaces of the base body. In addition, as can be appreciated from FIG. 3, the recessed portions 34 are provided on the sides of the second recessed portions 13 and 14 having small diameters, so that the first recessed portions 11 and 12 having large diameters can be formed up to the vicinities of the outer surfaces of the base body 1. For this reason, the transverse width L between both side surfaces of the base body 1 can be made small, which contributes to the miniaturization.

It should be understood that various alternatives to the structures described herein may be employed in practicing the present invention. For example, FIG. 2B shows a base body for making up a package, which accommodates four pairs of common mode choke coil and pulse transformer.

EXAMPLE

In one example of the invention, under the condition that the longitudinal width W was set to the same as that of a conventional example (9.67 mm max.), it became possible to shorten the transverse width L from 12.70 mm max. in the conventional example to 8.1 mm max., making it possible to reduce the mounting area by 35%.

However, to realize the aforementioned dimensions, in the example, the sizes and configurations of the CMCs 4 and 5 were made identical, and the outside diameters of the toroidal cores 2a and 3a of the PTs 2 and 3 were made small. Also, it is necessary to concurrently satisfy the characteristic that "the inductance value with 8 mA superposed should be greater than or equal to 350 μH" in ISO 8802.3 which is the standard for the LAN transmission path.

To satisfy these requirements, the thickness of the toroidal cores 2a and 23a was made large, the outside diameter was reduced from 4.4 mm to 3.25 mm, and the inside diameter was reduced from 2 mm to 1.4 mm, while the height was increased from 0.7 mm to 0.8 mm, the total numbers of turns of the primary windings and the secondary windings were increased by 2 turns.

In addition, in the example, to set the height to 2.1 mm max. in the same way as in the conventional example, the thickness of the base body 1 at the portions of the recessed portions 11 to 14 was reduced from 0.2 mm to 0.15 mm, the standoff (the difference in level between each of the bottom surfaces of the terminals 6a to 6f and 9a to 9f and the bottom surface of the base body 1) was reduced from 0.1 mm to 0.05 mm. In addition, as the windings of the PTs and CMCs, wires obtained by twisting single conductors were used instead of those in which four single conductors having a diameter of 0.07 mm were integrated by an adhesive.

Thus, in this example, it was possible to reduce the transverse width by 35% while keeping the longitudinal width and the height to be the same as in the conventional example, there by permitting a substantial miniaturization as compared with a conventional product. In addition, it became possible to reduce the insertion loss at 100 MHz from 0.68 dB in the conventional product to 0.40 dB.

This application is based upon and claims the benefit of priority of Japanese Patent Application No. 2005-183809 filed on Jun. 23, 2005, the contents of which are incorporated herein by reference in its entirety.

The invention claimed is:

1. A package for parts for LAN of a surface mounting type, comprising:
   a resin-made base body which is square, in which pluralities of terminals are respectively fixed at two opposing edges thereof, and which are adapted to accommodate a plurality of pulse transformers and a plurality of common mode choke coils which are respectively connected to the pulse transformers;
   a plurality of first recessed portions for respectively accommodating the plurality of pulse transformers and a plurality of second recessed portions having smaller diameters than those of the first recessed portions and adapted to respectively accommodate the plurality of common mode choke coils, the plurality of first recessed portions and the plurality of second recessed portions being provided in the surface of the base body where the parts are mounted;
   wherein the first recessed portions are formed on one terminal fixing edge side of the base body, and the second recessed portions are formed on another terminal fixing edge side thereof, the first recessed portions and the second recessed portions being arranged by being longitudinally connected in a direction from the one terminal fixing edge toward the other terminal fixing edge.

2. The package for parts for LAN according to claim 1, wherein adjacent ones of the first recessed portions and the second recessed portions are formed by being connected at one portion thereof.

3. The package for parts for LAN according to claim 1, wherein adjacent ones of the first recessed portions are formed by being connected at one portion thereof.

4. The package for parts for LAN according to claim 1, wherein an inner wall of at least one of the first recessed portions and the second recessed portions on the adjacent terminal fixing edge side is formed in a flat shape parallel to the terminal fixing edge.

5. The package for parts for LAN according to claim 1, wherein an inner wall of the first recessed portion on a side surface side thereof is formed in a flat shape parallel to a side surface of the base body.

6. The package for parts for LAN according to claim 1, further comprising:
   a resin-made square cover which is combined with the base body,
   wherein the cover has joining plate portions provided projectingly for being joined to the base body and retaining pawls respectively provided at distal ends of the joining plate portions, the joining plate portions and the retaining pawls being provided on a second recessed portion side on both side surfaces perpendicular to the terminal fixing edge when combined with the base body,
   wherein a pair of recessed portions are each provided on an outer side surface portions at a portion corresponding to the second recessed portion of the base body, and a pair of stepped portions are each provided by further recessing a base body fitting surface side of the recessed portion, and
   wherein the joining plate portions on both sides of the cover are respectively pressed and fitted to the recessed portions on the both side surfaces of the base body by making use of the resiliency of the joining plate portions, and the retaining pawls at the distal ends of the joining plate portions are respectively retained by the stepped portions, to thereby combine the cover with the base body.

7. A pulse transformer module for LAN, comprising:
   a plurality of pulse transformers and a plurality of common mode choke coils which are respectively connected to the pulse transformers;
   a resin-made base body which is square, in which pluralities of terminals are respectively fixed at two opposing edges thereof, and which are adapted to accommodate the pulse transformers and the common mode choke coils which are respectively connected to the pulse transformers;
   a plurality of first recessed portions for respectively accommodating the plurality of pulse transformers and a plurality of second recessed portions having smaller diameters than those of the first recessed portions and adapted to respectively accommodate the plurality of common mode choke coils, the plurality of first recessed portions and the plurality of second recessed portions being provided in the surface of the base body where the parts are mounted;
   wherein the first recessed portions are formed on one terminal fixing edge side of the base body, and the second recessed portions are formed on another terminal fixing edge side thereof, the first recessed portions and the second recessed portions being arranged by being longitudinally connected in a direction from the one terminal fixing edge toward the other terminal fixing edge.

* * * * *